United States Patent
Na et al.

(10) Patent No.: US 9,153,513 B2
(45) Date of Patent: Oct. 6, 2015

(54) EPOXY RESIN COMPOSITION AND SEMICONDUCTOR APPARATUS PREPARED USING THE SAME

(71) Applicant: Samsung SDI Co, Ltd., Yongin-si, Gyeonggi-do (KR)

(72) Inventors: Woo Chul Na, Uiwang-si (KR); Seung Han, Uiwang-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 14/334,767

(22) Filed: Jul. 18, 2014

(65) Prior Publication Data

US 2015/0021763 A1  Jan. 22, 2015

(30) Foreign Application Priority Data

Jul. 19, 2013 (KR) .......... 10-2013-0085673
Jan. 27, 2014 (KR) .......... 10-2014-0009925

(51) Int. Cl.
*H01L 23/29* (2006.01)
*C08K 7/18* (2006.01)
*H01L 23/00* (2006.01)

(52) U.S. Cl.
CPC .............. *H01L 23/295* (2013.01); *C08K 7/18* (2013.01); *H01L 24/17* (2013.01); *H01L 2224/16225* (2013.01); *H01L 2224/1713* (2013.01)

(58) Field of Classification Search
CPC .......... C08K 7/18; C08K 7/20; H01L 23/295
USPC ........................................................ 257/737
See application file for complete search history.

(56) References Cited

U.S. PATENT DOCUMENTS 5,360,837 A * 11/1994 Honda et al. ............ 523/220

* cited by examiner

*Primary Examiner* — Daniel Shook
(74) *Attorney, Agent, or Firm* — Lee & Morse, P.C.

(57) ABSTRACT

An epoxy resin composition includes an inorganic filler, an epoxy resin, and a curing agent. The inorganic filler has an average particle diameter D50 from about 2 μm to about 10 μm, an average particle diameter D10 of about 3 μm or less, and an average particle diameter D90 from about 6 μm to about 15 μm. Inorganic filler particles having a particle diameter of about 25 μm or more constitute about 0.1 wt % or less of the inorganic filler.

15 Claims, 2 Drawing Sheets

EPOXY RESIN COMPOSITION AND SEMICONDUCTOR APPARATUS PREPARED USING THE SAME

CROSS-REFERENCE TO RELATED APPLICATIONS

Korean Patent Application No. 10-2013-0085673, filed on Jul. 19, 2013, and Korean Patent Application No. 10-2014-0009925 filed on Jan. 27, 2014, in the Korean Intellectual Property Office, and entitled: "Epoxy Resin Composition And Semiconductor Apparatus Prepared Using The Same," are incorporated by reference herein in their entirety.

BACKGROUND

1. Field

Embodiments relate to an epoxy resin composition and a semiconductor apparatus prepared using the same.

2. Description of the Related Art

To protect a semiconductor device from external environments, such as moisture, mechanical impact and the like, the semiconductor device is encapsulated with an epoxy resin composition.

SUMMARY

Embodiments are directed to an epoxy resin composition including an inorganic filler, an epoxy resin, and a curing agent. The inorganic filler has an average particle diameter D50 from about 2 μm to about 10 μm, an average particle diameter D10 of about 3 μm or less, and an average particle diameter D90 from about 6 μm to about 15 μm. Inorganic filler particles having a particle diameter of about 25 μm or more constitute about 0.1 wt % or less of the inorganic filler.

The inorganic filler may have a particle diameter no greater than about 30 μm.

A particle diameter ratio of the average particle diameter D90 to the average particle diameter D50 may range from about 1.2 to about 5.0.

A particle diameter ratio of the average particle diameter D90 to the average particle diameter D10 may range from about 1.1 to about 150.

A particle diameter ratio of the average particle diameter D50 to the average particle diameter D10 may range from about 1.1 to about 30.

Inorganic filler particles having a particle diameter of about 20 μm or more may constitute about 0.1 wt % or less of the inorganic filler.

A ratio of pore volume to total volume including pores and the inorganic filler may range from about 0.1% to about 11% when a cubic container having a size of 50 mm×50 mm×50 mm (width×length×height) is filled with the inorganic filler.

The inorganic filler may include at least one of silica, calcium carbonate, magnesium carbonate, alumina, magnesia, clay, talc, calcium silicate, titanium oxide, antimony oxide, and glass fibers.

The inorganic filler may be present in the epoxy resin composition in an amount of about 70 wt % to about 95 wt %.

The epoxy resin composition may further include a curing catalyst.

The epoxy resin composition may include about 2 wt % to about 17 wt % of the epoxy resin, about 70 wt % to about 95 wt % of the inorganic filler, about 0.5 wt % to about 13 wt % of the curing agent, and about 0.01 wt % to about 2 wt % of the curing catalyst.

Embodiments are also directed to a semiconductor apparatus including at least one surface encapsulated with the epoxy resin composition as described above.

Embodiments are also directed to a semiconductor apparatus including at least one surface having thereon an epoxy encapsulant, the epoxy encapsulant including an inorganic filler having an average particle diameter D50 from about 2 μm to about 10 μm, an average particle diameter D10 of about 3 μm or less, and an average particle diameter D90 from about 6 μm to about 15 μm, and in the inorganic filler, inorganic filler particles having a particle diameter of about 25 μm or more constitute about 0.1 wt % or less of the inorganic filler.

The semiconductor apparatus may include a wiring board, bumps on the wiring board, and a semiconductor chip on the bumps. At least one of a gap between the wiring board and the semiconductor chip, and an upper surface of the semiconductor chip may be encapsulated with the epoxy resin composition. The semiconductor apparatus may satisfy at least one of the following conditions: a gap between the wiring board and the semiconductor chip ranges from about 20 μm to about 80 μm, a distance between the bumps ranges from about 20 μm to about 200 μm, the total number of the bumps with respect to a 1 mm$^2$ unit area of the wiring board ranges from about 5 to about 100, an area of the wiring board ranges from about 10 mm$^2$ to about 400 mm$^2$, an area of the semiconductor chip ranges from about 8 mm$^2$ to about 360 mm$^2$, the number of bumps arranged in one direction on the wiring board ranges from about 10 to about 500, a diameter of an air vent ranges from about 20 μm to about 30 μm, and a diameter of an injection hole of the epoxy resin composition ranges from about 500 μm to about 5000 μm.

Embodiments are also directed to a method of fabricating a semiconductor apparatus including providing a semiconductor device having at least one surface, and encapsulating the at least one surface using the epoxy resin composition as described above.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

As used herein, the terms "average particle diameter D10", "average particle diameter D50" and "average particle diameter D90" refer to particle diameters of the inorganic filler, the mass percentages of which correspond to 10 wt %, 50 wt % and 90 wt %, respectively, on the cumulative particle diameter distribution curve plotted by measuring the particle diameters of the inorganic filler. The particle diameters of the inorganic filler may be measured using a particle size analyzer (PSA), for example.

In one embodiment, an epoxy resin composition may include an inorganic filler, an epoxy resin, and a curing agent, wherein the inorganic filler may have: (i) an average particle diameter D50 from about 2 μm to about 10 μm; (ii) an average particle diameter D10 of about 3 μm or less; and (iii) an average particle diameter D90 from about 6 μm to about 15 μm. Inorganic filler particles having a particle diameter of about 25 μm or more, for example, from about 25 μm to about 50 μm, may constitute about 0.1% wt % or less of the inorganic filler. The epoxy resin composition may sufficiently encapsulate a semiconductor apparatus having a narrow gap between a semiconductor device and a wiring board, and may have good flowability, thereby minimizing voids and/or leakage while securing good reliability of the semiconductor apparatus.

The inorganic filler may be used for improvement in mechanical properties and for low stress of the epoxy resin composition. The inorganic filler may be formed of a mixture of inorganic fillers having different particle diameters. The epoxy resin composition may be used for encapsulating of semiconductor devices. In recent years, a gap between a semiconductor device and a wiring board has become increasingly narrower. Accordingly, it is desirable that the inorganic filler have as small a maximum particle diameter as possible. On the other hand, if the maximum particle diameter is too small, the epoxy resin composition may suffer a deterioration in flowability, causing the semiconductor device to exhibit voids, a deterioration in reliability and the like. Moreover, a semiconductor device may exhibit a deterioration in reliability due to leakage to an air vent after encapsulating. According to embodiments, the inorganic filler may be controlled in terms of average particle diameter D50, average particle diameter D10, average particle diameter D90, and ratio of inorganic fillers having a particle diameter of about 25 μm or more. An epoxy resin composition that may encapsulate the narrow gap between the semiconductor device and the wiring board, may exhibit good flowability, may avoid voids and leakage, and may secure good reliability of a semiconductor device may be provided.

Maintaining the average particle diameter D50 of the inorganic filler at about 2 μm or more may help the epoxy resin composition maintain flowability and avoid leakage through an air vent hole after the gap between the semiconductor device and the wiring board is filled with the epoxy resin composition, which may help avoid void generation. In addition, if the average particle diameter D50 is about 10 μm or less, the epoxy resin composition may completely fill the gap due to sufficient flowability thereof. If the average particle diameter D10 is about 3 μm or less, the epoxy resin composition may completely fill the gap due to sufficient flowability thereof, which enhance the reliability of the semiconductor devices. If the average particle diameter D90 is about 9 μm or more, the epoxy resin composition may exhibit sufficient flowability, such that the semiconductor apparatus may avoid leakage after encapsulating of the gap between the semiconductor device and the wiring board and reliability may be enhanced. Further, if the average particle diameter D90 is about 15 μm or less, the epoxy resin composition may sufficiently fill the gap due to good flowability, thereby enhancing the reliability of the semiconductor device. If the amount of inorganic filler having a particle diameter of 25 μm or more is about 0.1 wt % or less based on the total amount of the inorganic filler, the epoxy resin composition may completely fill the gap due to good flowability, thereby enhancing the reliability of the semiconductor device.

For example, the inorganic filler may have: an average particle diameter D50 from about 2 μm to about 10 μm, from about 2 μm to about 8 μm, or from about 5 μm to about 10 μm, for example, of about 2 μm, 3 μm, 4 μm, 5 μm, 6 μm, 7 μm, 8 μm, 9 μm, or 10 μm; an average particle diameter D10 of about 3 μm or less, for example, from about 0.001 μm to about 3 μm, for example, of about 0.001 μm, 1 μm, 2 μm, or 3 μm; and an average particle diameter D90 from about 6 μm to about 15 μm, or from about 7 μm to about 15 μm, for example, of about 6 μm, 7 μm, 8 μm, 9 μm, 10 μm, 11 μm, 12 μm, 13 μm, 14 μm, or 15 μm. In addition, the amount of the inorganic filler having a particle diameter of about 25 μm or more may be about 0.1% wt % or less, for example, about 0.001 wt % to about 0.1 wt %, for example, about 0.001 wt %, 0.01 wt %, 0.03 wt %, 0.05 wt %, 0.07 wt %, 0.09 wt %, or 0.1 wt % of the inorganic filler.

The inorganic filler may have a relationship of: average particle diameter $D10$<average particle diameter $D50$<average particle diameter $D90$. A particle diameter ratio of the average particle diameter D90 to the average particle diameter D50 may range from about 1.2 to about 5.0, for example, from about 1.2 to about 3.0. A particle diameter ratio of the average particle diameter D50 to the average particle diameter D10 may range from about 1.1 to about 30.0, for example, from about 2 to about 10. A particle diameter ratio of the average particle diameter D90 to the average particle diameter D10 may range, for example, from about 1.1 to about 150, for example, from about 5 to about 20. Within this range, the epoxy resin composition may sufficiently fill the narrow gap, may not cause void generation or leakage, and may secure good reliability.

The inorganic filler may have a particle diameter of about 50 μm or less, for example, of about 30 μm or less, for example, from about 0.0001 μm to 50 μm. The inorganic filler may have Brunauer-Emmett-Teller (BET) specific surface area from about 2 $m^2/g$ to about 8 $m^2/g$, for example, from about 2 $m^2/g$ to about 4 $m^2/g$, for example, of about 2 $m^2/g$, 3 $m^2/g$, 4 $m^2/g$, 5 $m^2/g$, 6 $m^2/g$, 7 $m^2/g$, or 8 $m^2/g$, as measured by a gas adsorption method. Within this range, the epoxy resin composition may sufficiently fill the narrow gap, may not cause void generation or leakage, and may secure good reliability.

The amount of the inorganic filler having a particle diameter of about 20 μm or more, for example, from about 20 μm to about 50 μm may be about 0.1 wt % or less, for example, about 0.001 wt % to about 0.1 wt % of (v) the inorganic filler. Within this range, the epoxy resin composition may sufficiently fill the narrow gap, may not cause void generation or leakage, and may secure good reliability.

The inorganic filler may have a porosity from about 0.1% to about 11%, for example from about 1% to about 10%. Within this range, the epoxy resin composition may sufficiently fill the narrow gap, may not cause void generation or leakage, and may secure good reliability. When a cubic container having a size of 50 mm×50 mm×50 mm (width×length×height) is filled with the inorganic filler, the porosity may be defined as a ratio of pore volume to total volume including pores and the inorganic filler, based on an assumption that the inorganic filler is free from pores therein.

Based on the total amount of the inorganic filler, an amount of the inorganic filler having a particle diameter of 1 μm or less for example about 0.001 μm to 1 μm may be present in an amount of about 0.1 wt % to about 35 wt %, specifically about 5 wt % or 35 wt %, for example, about 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, 20 wt %, 21 wt %, 22 wt %, 23 wt %, 24 wt %, 25 wt %, 26 wt %, 27 wt %, 28 wt %, 29 wt %, 30 wt %, 31 wt %, 32 wt %, 33 wt %, 34 wt %, or 35 wt %. An amount of the inorganic filler having a particle diameter from about 6 μm to about 12 μm may be about 30 wt % to about 65 wt %, specifically about 30 wt % or 60 wt %, for example, about 30 wt %, 31 wt %, 32 wt %, 33 wt %, 34 wt %, 35 wt %, 36 wt %, 37 wt %, 38 wt %, 39 wt %, 40 wt %, 41 wt %, 42 wt %, 43 wt %, 44 wt %, 45 wt %, 46 wt %, 47 wt %, 48 wt %, 49 wt %, 50 wt %, 51 wt %, 52 wt %, 53 wt %, 54 wt %, 55 wt %, 56 wt %, 57 wt %, 58 wt %, 59 wt %, or 60 wt %. Within this range, the epoxy resin composition may exhibit excellent reliability and moldability.

The inorganic filler may include particles having a circular cross-sectional shape, an elliptical cross-sectional shape, or modified circular cross-sectional shapes, as examples. For example, spherical particles may be used as the inorganic filler to secure pores. The inorganic filler may be formed of at least one of silica such as fused silica, crystalline silica and the like, calcium carbonate, magnesium carbonate, alumina, magnesia, clay, talc, calcium silicate, titanium oxide, antimony oxide, and glass fibers, as examples. The inorganic filler may be fused silica fillers having a low coefficient of linear expansion to secure low stress of the epoxy resin composition.

The inorganic filler may be present in an amount of about 70 wt % to about 95 wt %, for example, about 75 wt % to about 92 wt %, for example about 70 wt %, about 71 wt %, about 72 wt %, about 73 wt %, about 74 wt %, about 75 wt %, about 76 wt %, about 77 wt %, about 78 wt %, about 79 wt %, about 80 wt %, about 81 wt %, about 82 wt %, about 83 wt %, about 84 wt %, about 85 wt %, about 86 wt %, about 87 wt %, about 88 wt %, about 89 wt %, about 90 wt %, about 91 wt %, or about 92 wt % in the epoxy resin composition. Within this range, the epoxy resin composition may secure flame retardancy, flowability, and reliability.

The epoxy resin may include an epoxy compound having at least two epoxy groups. The epoxy resin may include a liquid epoxy resin in consideration of viscosity and purpose of the epoxy resin composition. For example, the epoxy resin may include at least one of a phenol novolac type epoxy resin, a cresol novolac type epoxy resin, a biphenyl type epoxy resin, a phenol aralkyl type epoxy resin, a polyfunctional epoxy resin, a naphthol novolac type epoxy resin, a novolac type epoxy resin of bisphenol A/bisphenol F/bisphenol AD, a glycidyl ether of bisphenol A/bisphenol F/bisphenol AD, a bishydroxybiphenyl epoxy resin, a dicyclopentadiene epoxy resin, and an epoxy resin obtained by epoxidation of a condensate of a phenol or alkyl phenol and hydroxybenzaldehyde.

In one embodiment, the epoxy resin may be a phenol aralkyl type epoxy resin represented by Formula 1, or a biphenyl type epoxy resin represented by Formula 2:

<Formula 1> wherein n has an average value from 1 to 7;

<Formula 2> wherein R is a $C_1$ to $C_4$ alkyl group, and n has an average value from 0 to 7). For example, R may be a methyl group or an ethyl group.

The epoxy resin may be used alone, or be used as an adduct compound prepared by pre-reaction, such as melt master batch, of an epoxy resin with other components, such as a curing agent, a curing catalyst, a releasing agent, a coupling agent, a stress relieving agent, and the like. In addition, an epoxy resin containing a low amount of chlorine ions, sodium ions and other ionic impurities may be used in order to improve moisture resistance. The epoxy resin may be used alone or in combination thereof. The epoxy resin may be present in an amount of about 2 wt % to about 17 wt %, for example, about 3 wt % to about 15 wt %, for example, about 3 wt % to about 12 wt %, for example about 2 wt %, about 3 wt %, about 4 wt %, about 5 wt %, about 6 wt %, about 7 wt %, about 8 wt %, about 9 wt %, about 10 wt %, about 11 wt %, about 12 wt %, about 13 wt %, about 14 wt %, about 15 wt %, about 16 wt % or about 17 wt % of the epoxy resin composition. Within this range, the epoxy resin composition may exhibit good flowability, flame retardancy, and reliability.

The curing agent may be a curing agent for epoxy resins. The curing agent may include a solid or a liquid curing agent. For example, the curing agent may include at least one of a phenol aralkyl type phenol resin, a phenol novolac type phenol resin, a xylok type phenol resin, a cresol novolac type phenol resin, a naphthol type phenol resin, a terpene type phenol resin, a polyfunctional phenol resin, a dicyclopentadiene phenol resin, a novolac type phenol resin synthesized from bisphenol A and resol, tris(4-hydroxyphenyl)methane, a polyvalent phenol compound such as dihydroxybiphenyl, an acid anhydride such as maleic anhydride and phthalic anhydride, a phenylenediamine such as m-phenylenediamine or the like, and an aromatic amine, such as diaminodiphenylmethane, diaminodiphenylsulfone or the like. For example, the curing agent may be a phenol aralkyl type phenol resin. In one embodiment, the curing agent may be a phenol aralkyl type phenol resin represented by Formula 3:

<Formula 3> wherein n has an average value from 1 to 7.

The curing agent may be used as an adduct compound prepared by pre-reaction, such as a melt master batch, of a curing agent with other components, such as the epoxy resin and the like. The curing agent may be used alone or in combination thereof. The curing agent may be present in an amount of about 0.5 wt % to about 13 wt %, for example, about 1 wt % to about 10 wt %, for example, about 2 wt % to about 8.5 wt % of the epoxy resin composition. Within this range, unreacted epoxy groups and phenolic hydroxyl groups may not be generated in a large amount. Accordingly, the epoxy resin composition may exhibit excellent reliability.

A mixing ratio of the epoxy resin and the curing agent may be adjusted depending upon desired mechanical properties and moisture resistance in a package. In one embodiment, a chemical equivalent ratio of the epoxy resin to the curing agent may range from about 0.95 to about 2, for example, from about 1 to about 1.75.

The epoxy resin may further include a curing catalyst, which catalyzes a reaction between the epoxy resin and the curing agent. For example, the curing agent may include a tertiary amine, an organic metal compound, an organic phosphorus compound, an imidazole, or a boron compound. Examples of the tertiary amine may include benzyldimethylamine, triethanolamine, triethylenediamine, diethylaminoethanol, tri(dimethylaminomethyl)phenol, 2-2-(dimethylaminomethyl)phenol, 2,4,6-tris(diaminomethyl)phenol or salt of tri(2-ethylhexanoate) thereof, or the like. Examples of the organic metal compound may include chromium acetylacetonate, zinc acetylacetonate, nickel acetylacetonate, or the like. Examples of the organic phosphorus compound may include tris-4-methoxyphosphine, tetrabutylphosphonium bromide, tetraphenylphosphonium bromide, triphenylphosphine, triphenylphosphinetriphenylborane, triphenylphosphine-1,4-benzoquinone adducts, or the like. Examples of the imidazole may include 2-methylimidazole, 2-phenylimidazole, 2-aminoimidazole, 2-methyl-1-vinylimidazole, 2-ethyl-4-methylimidazole, 2-heptadecylimidazole, or the like. Examples of the boron compound may include tetraphenylphosphonium-tetraphenylborate, triphenylphosphine tetraphenylborate, tetraphenylboron salts, trifluoroborane-n-hexylamine, trifluoroborane monoethylamine, tetrafluoroborane triethylamine, tetrafluoroborane amine, or the like. The curing catalyst may include 1,5-diazabicyclo[4.3.0]non-5-ene (DBN), 1,8-diazabicyclo[5.4.0]undec-7-ene (DBU), a phenol novolac resin salt, or the like. The curing catalyst may be used alone or in combination thereof. The curing catalyst may be an adduct prepared by pre-reaction of a curing catalyst with the epoxy resin or the curing agent. The curing catalyst may be present in an amount of about 0.01 wt % to about 2 wt %, for example, about 0.02 wt % to about 1.5 wt %, for example, about 0.05 wt % to about 1.5 wt % in the epoxy resin composition. Within this range, the epoxy resin composition may secure flowability without delaying curing reaction time.

The epoxy resin composition may further include an additive, such as a coupling agent, a releasing agent, a stress relieving agent, a crosslinking promoter, a leveling agent, a colorant, or the like. The additive may be present in an amount of about 0.1 wt % to about 10 wt %, for example, about 0.1 wt % to about 3 wt % in the epoxy resin composition.

The coupling agent may include at least one selected from the group of epoxysilane, aminosilane, mercaptosilane, alkylsilane, and alkoxysilane, as examples. The coupling agent may be present in an amount of about 0.1 wt % to about 1 wt % in the epoxy resin composition.

The releasing agent may include at least one selected from the group of paraffin wax, ester wax, higher fatty acids, metallic salts of higher fatty acid, natural fatty acids, and metallic salts of natural fatty acid. The releasing agent may be present in an amount of about 0.1 wt % to about 1 wt % in the epoxy resin composition.

The stress-relieving agent may include at least one selected from the group of modified silicone oils, silicone elastomers, silicone powders, and silicone resins, as examples. The stress-relieving agent may be present in an amount of about 0.1 wt % to about 1 wt % in the epoxy resin composition. The stress relieving agent may be used alone or in combination thereof. The modified silicone oil may be a silicone polymer exhibiting excellent heat resistance. The modified silicone oil may be prepared using at least one selected from the group of epoxy functional group-containing silicone oils, amine functional group-containing silicone oils, carboxyl functional group-containing silicone oils, and combinations thereof. The modified silicone oil may be present in an amount of about 0.05 wt % to about 1.5 wt % in the epoxy resin composition. If the amount of the silicone oil is greater than 1.5 wt %, there may be concerns of easy surface contamination and long resin bleeding. If the amount of the silicone oil is less than 0.05 wt %, there may be a problem in that the epoxy resin composition may not obtain a sufficiently low elastic modulus. When the silicone powder having a median particle diameter of about 15 μm or less is used, the silicone powder may not cause deterioration in moldability of the epoxy resin composition, and thus, may be particularly advantageous. The silicone powder may be present in an amount of about 0.1 wt % to about 5 wt % in the epoxy resin composition.

The colorant may be a colorant used in laser marking or the like. The colorant may include carbon black, titanium oxide, titanium nitride, iron oxide, mica, or the like. The colorant may be present in an amount of about 0.05 wt % to about 4.0 wt % in the epoxy resin composition.

The epoxy resin composition may have a viscosity from about 0.1 poise to about 2.0 poise at 150° C. Within this range, the epoxy resin composition may sufficiently fill the narrow gap.

The epoxy resin composition may be prepared by the following method, as an example. Components included in the composition may be uniformly mixed using a Henschel mixer or a Lödige mixer, followed by melting and kneading at about 90° C. to about 120° C. using a roll mill or a kneader, and then cooled and pulverized, thereby preparing the epoxy resin composition. Low-pressure transfer molding may be generally used as a method for encapsulating a semiconductor device using the epoxy resin composition. Injection molding or cast molding may also be used. With these methods, a semiconductor device having a copper lead frame, an iron lead frame, a lead frame prepared by pre-plating the aforementioned lead frames with at least one selected from the group consisting of nickel, copper and palladium, or an organic laminate frame may be fabricated.

In accordance with another embodiment, a semiconductor apparatus may include a semiconductor device, such as an active device including a semiconductor chip, a transistor, a diode or the like, or a passive devices including a condenser, a resistor, a coils or the like, mounted on a wiring board such as a printed circuit board (PCB) or the like, or a support substrate such as a glass or the like. The semiconductor device may be encapsulated with an epoxy resin composition. The epoxy resin composition may include an epoxy resin, a curing agent, and an inorganic filler. Here, the inorganic filler may have: (a1) an average particle diameter D50 from about 2 μm to about 10 μm; (a2) an average particle diameter D10 of about 3 μm or less; and (a3) an average particle diameter D90 from about 6 μm to about 15 μm, and (a4) an amount of inorganic filler particles having a particle diameter of about 25 μm or more of 0.1 wt % or less of the inorganic filler.

In one embodiment, the semiconductor apparatus may have a predetermined range of at least one of: (b1) a gap between the wiring board and the semiconductor device; (b2) a distance between bumps; (b3) the total number of bumps with respect to a unit area (1 mm$^2$) of the wiring board; (b4) an area of the wiring board; (b5) an area of the semiconductor device; (b6) the number of bumps arranged in one direction on the wiring board; (b7) a diameter of an air vent; and (b8) a diameter of an injection hole of the epoxy resin composition.

Figure 1:
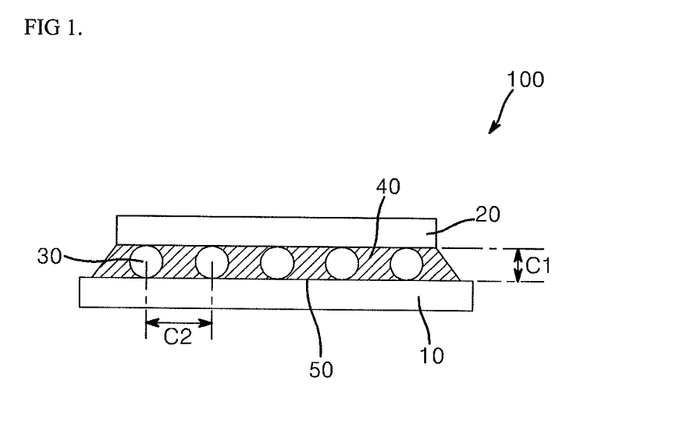
FIG. 1 illustrates a cross-sectional view of a semiconductor apparatus according to an embodiment.
Figure 2:
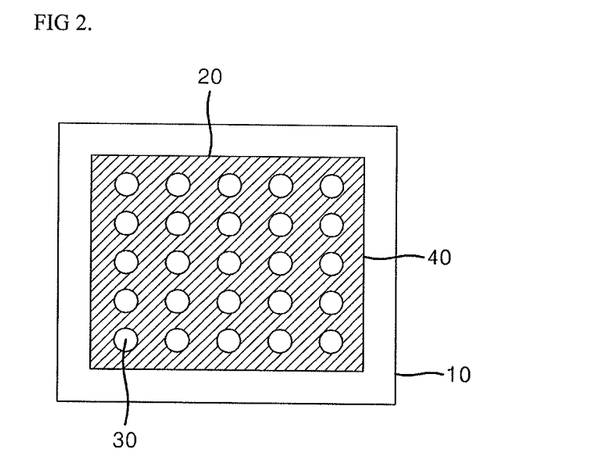
FIG. 2 illustrates a top view of the semiconductor apparatus according to the embodiment.

FIGS. 1 and 2 illustrate a cross-sectional view and a top view, respectively, of a semiconductor apparatus according to an embodiment. Referring to FIGS. 1 and 2, a semiconductor apparatus 100 may include: a wiring board 10; bumps 30 formed on the wiring board 10; and a semiconductor chip 20 formed on the bumps 30, wherein a gap between the wiring board 10 and the semiconductor chip 20 may be encapsulated with an epoxy resin composition 40. (b1) A gap (C1) between the wiring board 10 and the semiconductor chip 20 may range from 30 μm to 100 μm, for example, from about 20 μm to about 80 μm; (b2) a distance (C2) between bumps 30, which corresponds to an interval between centers of the bumps 30, may range from about 20 μm to about 200 μm; (b3) the total number of bumps 30 with respect to a unit area (1 mm$^2$) of the wiring board 10 may range from about 5 to about 100; (b4) an area of the wiring board 10 may range from about 10 mm$^2$ to about 400 mm$^2$; (b5) an area of the semiconductor chip 20 may range from about 8 mm$^2$ to about 360 mm$^2$; (b6) the total number of bumps arranged in one direction on the wiring board 10 may range from about 10 to about 500; (b7) a diameter of an air vent may range from about 20 μm to about 30 μm; and (b8) a diameter of an injection hole of the epoxy resin composition may range from about 500 μm to about 5000 μm. The semiconductor apparatus may be fabricated by arranging a plurality of bumps 30 at predetermined intervals on the wiring board 10, securing the semiconductor chip 20 to an upper surface of the wiring board 10, injecting the epoxy resin composition into an under-fill portion 50 formed between the wiring board and the semiconductor chip 20 through the injection hole, and discharging air through the air vent.

Figure 3:
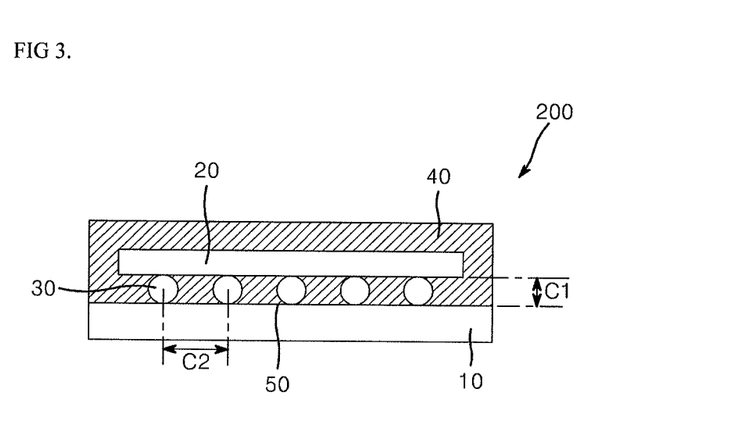
FIG. 3 illustrates a cross-sectional view of a semiconductor apparatus according to another embodiment.

FIG. 3 illustrates a cross-sectional view of a semiconductor apparatus according to another embodiment. Referring to FIG. 3, a semiconductor apparatus 200 may include a wiring board 10, bumps 30 formed on the wiring board 10, and a semiconductor chip 20 formed on the bumps 30, wherein a gap between the wiring board 10 and the semiconductor chip 20, and an overall upper surface of the semiconductor chip 20 may be encapsulated with an epoxy resin composition 40. In FIGS. 1 to 3, the wiring board, the size of the semiconductor, and the number of the bumps are provided for illustration only and may be changed.

The following Examples and Comparative Examples are provided in order to highlight characteristics of one or more embodiments, but it is to be understood that the Examples and Comparative Examples are not to be construed as limiting the scope of the embodiments, nor are the Comparative Examples to be construed as being outside the scope of the embodiments. Further, it is to be understood that the embodiments are not limited to the particular details described in the Examples and Comparative Examples.

Components used in Examples and Comparative Examples are as follows.

A) Epoxy resin

A1) Phenol aralkyl type epoxy resin (NC-3000, Nippon Kayaku Co., Ltd.)

A2) Biphenyl type epoxy resin (YX-4000, Japan Epoxy Resin Co., Ltd.)

B) Curing agent: Phenol aralkyl type phenol resin (MEH-7851SS, Meiwa Co., Ltd.)

C) Inorganic fillers: Spherical fused silica of Table 1

D) Curing catalyst: Triphenylphosphine (TPP-k, Hokko Chemical Co., Ltd.)

E) Coupling agent: E1) Methyltrimethoxysilane (SZ-6070, Dow Corning Chemical Co., Ltd.), E2) Amine-based silane (KBM-573, Shin Etsu Silicon Co., Ltd.)

F) Colorant: Carbon black

G) Releasing agent: Carnauba wax

TABLE 1

| | | Inorganic filler | | | |
|---|---|---|---|---|---|
| | | C1 | C2 | C3 | C4 |
| Average particle diameter (μm) | D10 | 2 | 3 | 4 | 0.01 |
| | D50 | 5 | 10 | 12 | 8 |
| | D90 | 14 | 12 | 18 | 12 |
| Ratio of inorganic filler having particle diameter of 25 μm or more (wt %) | | 0.1 | 0.01 | 0.01 | 1.0 |
| Cumulative frequency (wt %) | 1 μm or less | 1.5 | 1.0 | 0.5 | 10.0 |
| | 3 μm or less | 20.0 | 10.0 | 5.0 | 15.0 |
| | 6 μm or less | 50.0 | 35.0 | 25.0 | 40.0 |
| | 12 μm or less | 88.0 | 97.0 | 83.0 | 92.0 |
| | 25 μm or less | 100.0 | 100.0 | 100.0 | 99.0 |
| | 50 μm or less | 100.0 | 100.0 | 100.0 | 100.0 |
| BET (g/m$^2$) | | 4.0 | 4.0 | 3.5 | 5.0 |
| Maximum particle diameter (μm) | | 25 | 25 | 25 | 35 |
| Porosity (%) | | 3 | 5 | 12 | 15 |

The particle diameter was measured using a PSA; the average particle diameter D50, the average particle diameter D10, the average particle diameter D90 and the ratio of silica particles having a particle diameter of 25 μm or more were calculated based on the measured particle diameter; and BET was measured by gas adsorption.
The porosity was calculated as the ratio of pore volume to total volume including pores and the inorganic filler when a cubic container having a size of 50 mm × 50 mm × 50 mm (width × length × height) was filled with the inorganic filler.

Examples 1 to 6 and Comparative Examples 1 to 6

Components were uniformly mixed using a Henschel mixer (KSM-22, KEUM SUNG MACHINERY CO., LTD) in amounts as listed in Tables 2 and 3 (unit: parts by weight), followed by melting and kneading at 90° C. to 110° C. using a continuous kneader, and then cooled and pulverized, thereby preparing epoxy resin compositions for encapsulating of semiconductor devices.

TABLE 2

| Component (unit: parts by weight) | | Example 1 | Example 2 | Example 3 | Example 4 | Example 5 | Example 6 |
|---|---|---|---|---|---|---|---|
| A | A1 | 5.62 | 6.23 | 6.91 | 5.62 | 6.23 | 6.91 |
|   | A2 | 2.75 | 3.14 | 3.62 | 2.75 | 3.14 | 3.62 |
| B |   | 6.61 | 7.59 | 8.40 | 6.61 | 7.59 | 8.40 |
| D |   | 0.21 | 0.23 | 0.26 | 0.21 | 0.23 | 0.26 |
| C | C1 | 84 | 82 | 80 | — | — | — |
|   | C2 | — | — | — | 84 | 82 | 80 |
| E | E1 | 0.20 | 0.15 | 0.12 | 0.20 | 0.15 | 0.15 |
|   | E2 | 0.10 | 0.15 | 0.18 | 0.10 | 0.15 | 0.15 |
| F |   |   |   |   | 0.26 |   |   |
| G |   |   |   |   | 0.25 |   |   |

TABLE 3

| Component (unit: parts by weight) | | Comparative Example 1 | Comparative Example 2 | Comparative Example 3 | Comparative Example 4 | Comparative Example 5 | Comparative Example 6 |
|---|---|---|---|---|---|---|---|
| A | A1 | 5.62 | 6.23 | 6.91 | 5.62 | 6.23 | 6.91 |
|   | A2 | 2.75 | 3.14 | 3.62 | 2.75 | 3.14 | 3.62 |
| B |   | 6.61 | 7.59 | 8.40 | 6.61 | 7.59 | 8.40 |
| D |   | 0.21 | 0.23 | 0.26 | 0.21 | 0.23 | 0.26 |
| C | C3 | 84 | 82 | 80 | — | — | — |
|   | C4 | — | — | — | 84 | 82 | 80 |
| E | E1 | 0.20 | 0.15 | 0.12 | 0.20 | 0.15 | 0.15 |
|   | E2 | 0.10 | 0.15 | 0.18 | 0.10 | 0.15 | 0.15 |
| F |   |   |   |   | 0.26 |   |   |
| G |   |   |   |   | 0.25 |   |   |

The prepared epoxy resin compositions were evaluated as to the following properties. In a semiconductor apparatus into which the epoxy resin composition was injected, a gap between a wiring board and a semiconductor chip was 50 μm; a distance between bumps, which corresponds to an interval between centers of the bumps, was 150 μm; the total number of bumps with respect to a unit area (1 mm$^2$) of the wiring board was 100; an area of the wiring board was 200 mm$^2$; an area of the semiconductor chip was 100 mm$^2$; the number of bumps arranged in one direction on the wiring board was 100; a diameter of an air vent was 30 μm; and a diameter of an injection hole of the epoxy resin composition was 3000 μm.

1) Spiral flow: Using a low-pressure transfer molding machine, the epoxy resin composition was injected into a mold for spiral flow measurement in accordance with EMMI-1-66 at a molding temperature of 175° C. and at a molding pressure of 70 kgf/cm$^2$, followed by measuring a flow field (unit: inch). Higher values represent better flowability of the epoxy resin composition.

2) Void: Each of the epoxy resin compositions was subjected to transfer molding at 175° C. for 120 seconds using a multi plunger system (MPS) molding machine, thereby preparing 200 FBGA packages (77.5 mm×240 mm) per composition. The packages were subjected to post-curing at 175° C. for 2 hours, followed by cooling to room temperature. Next, the packages were observed as to the number of voids through the naked eye and a nondestructive inspection apparatus (C-SAM).

3) Leakage: Each of the epoxy resin compositions was subjected to transfer molding into a QFN package using a multi plunger system (MPS) molding machine at 175° C. for 120 seconds. The number of EMCs leaking through an air vent placed at an end of the QFN package was measured.

4) Reflow resistance: The 200 FBGA packages after completion of moldability evaluation were heated at 175° C. for 2 hours, followed by drying at 175° C. for 24 hours. Next, the 200 FBGA packages were subjected to a thermal shock test of 5 cycles (1 cycle represents that the package was left at −65° C. for 10 minutes, at 25° C. for 5 minutes, and at 150° C. for 10 minutes, in order). Next, the packages were left at 85° C. and 60% RH for 168 hours, followed by repeating IR reflow three times at 260° C. for 30 seconds as a precondition. Next, cracks on the packages were observed through the naked eye and a nondestructive inspection apparatus (C-SAM).

TABLE 4

| | Evaluation property | Example | | | | | | Comparative Example | | | | | |
|---|---|---|---|---|---|---|---|---|---|---|---|---|---|
| | | 1 | 2 | 3 | 4 | 5 | 6 | 1 | 2 | 3 | 4 | 5 | 6 |
| Spiral flow (inch) | | 60 | 72 | 85 | 55 | 65 | 78 | 45 | 55 | 67 | 43 | 54 | 66 |
| Mold-ability | Number of packages suffering from void (Fail number/Total number) | 2/198 | 0/194 | 0/196 | 5/198 | 2/194 | 0/196 | 15/198 | 4/194 | 1/196 | 21/198 | 5/194 | 2/196 |
| | Number of packages suffering from leakage (Fail number/Total number) | 0/128 | 0/128 | 1/128 | 2/128 | 3/128 | 8/128 | 89/128 | 52/128 | 38/128 | 102/128 | 86/128 | 64/128 |

TABLE 4-continued

|  | Evaluation property | Example | | | | | | Comparative Example | | | | | |
| --- | --- | --- | --- | --- | --- | --- | --- | --- | --- | --- | --- | --- | --- |
|  |  | 1 | 2 | 3 | 4 | 5 | 6 | 1 | 2 | 3 | 4 | 5 | 6 |
| Reliability | Reflow resistance (Number of packages suffering from crack/Total number) | 1/198 | 0/194 | 0/196 | 3/198 | 1/194 | 0/196 | 12/198 | 3/194 | 0/196 | 19/198 | 4/194 | 1/196 |

As shown in Table 4, the epoxy resin compositions according to the Examples exhibited good flowability, good reflow resistance and a low leakage generation rate. Thus, the epoxy resin compositions may realize a semiconductor apparatus exhibiting good reliability. Thus, embodiments provide an epoxy resin composition that may sufficiently encapsulate a semiconductor apparatus having a narrow gap between a semiconductor device and a wiring board, that exhibits good flowability, that does not cause voids and/or leakage, and that secures good reliability of the semiconductor apparatus.

Conversely, the resin compositions of Comparative Examples 1 to 6, which were outside the ranges according to embodiments in terms of average particle diameter D10, average particle diameter D50, average particle diameter D90, and the amount of inorganic filler having a particle diameter of 25 μm or more, exhibited issues in terms of voids, leakage, flowability, reliability, or the like.

By way of summation and review, as a gap between a semiconductor device and a wiring board becomes narrower, a package of the semiconductor device and the wiring board becomes thinner. Such a package may be prepared in a flip-chip structure, in which case a space to be encapsulated with the epoxy resin composition becomes increasingly narrower. Thus, it is desirable to develop inorganic fillers constituting most of the epoxy resin composition. To sufficiently encapsulate the narrow gap between the semiconductor device and the wiring board, it is desirable that the inorganic fillers have a small particle diameter. However, if the particle diameter of an inorganic filler is too small, the epoxy resin composition may exhibit poor flowability and thus, voids may be created. The semiconductor may suffer from deterioration in reliability due to leakage of the epoxy resin composition to an air vent after final encapsulating. On the other hand, if the particle diameter of an inorganic filler is too large, the epoxy resin composition may exhibit too high flowability and thus may not sufficiently fill the gap, thereby causing deterioration in reliability of the semiconductor device. As noted above, embodiments provide an epoxy resin composition that may sufficiently encapsulate a semiconductor apparatus having a narrow gap between a semiconductor device and a wiring board, that exhibits good flowability, that does not cause voids and/or leakage, and that secures good reliability of the semiconductor apparatus.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An epoxy resin composition, comprising:
an inorganic filler;
an epoxy resin; and
a curing agent,
wherein:
the inorganic filler has an average particle diameter D50 from about 2 μm to about 10 μm, an average particle diameter D10 of about 3 μm or less, and an average particle diameter D90 from about 6 μm to about 15 μm, and
in the inorganic filler, inorganic filler particles having a particle diameter of about 25 μm or more constitute about 0.1 wt % or less of the inorganic filler.

2. The epoxy resin composition as claimed in claim 1, wherein the inorganic filler has a particle diameter no greater than about 30 μm.

3. The epoxy resin composition as claimed in claim 1, wherein a particle diameter ratio of the average particle diameter D90 to the average particle diameter D50 ranges from about 1.2 to about 5.0.

4. The epoxy resin composition as claimed in claim 1, wherein a particle diameter ratio of the average particle diameter D90 to the average particle diameter D10 ranges from about 1.1 to about 150.

5. The epoxy resin composition as claimed in claim 1, wherein a particle diameter ratio of the average particle diameter D50 to the average particle diameter D10 ranges from about 1.1 to about 30.

6. The epoxy resin composition as claimed in claim 1, wherein inorganic filler particles having a particle diameter of about 20 μm or more constitute about 0.1 wt % or less of the inorganic filler.

7. The epoxy resin composition as claimed in claim 1, wherein a ratio of pore volume to total volume including pores and the inorganic filler ranges from about 0.1% to about 11% when a cubic container having a size of 50 mm×50 mm×50 mm (width×length×height) is filled with the inorganic filler.

8. The epoxy resin composition as claimed in claim 1, wherein the inorganic filler includes at least one of silica, calcium carbonate, magnesium carbonate, alumina, magnesia, clay, talc, calcium silicate, titanium oxide, antimony oxide, and glass fibers.

9. The epoxy resin composition as claimed in claim 1, wherein the inorganic filler is present in the epoxy resin composition in an amount of about 70 wt % to about 95 wt %.

10. The epoxy resin composition as claimed in claim 1, further comprising a curing catalyst.

11. The epoxy resin composition as claimed in claim 10, including:
about 2 wt % to about 17 wt % of the epoxy resin,
about 70 wt % to about 95 wt % of the inorganic filler,
about 0.5 wt % to about 13 wt % of the curing agent, and
about 0.01 wt % to about 2 wt % of the curing catalyst.

12. A semiconductor apparatus including at least one surface encapsulated with the epoxy resin composition as claimed in claim 1.

13. A method of fabricating a semiconductor apparatus, the method comprising
providing a semiconductor device having at least one surface; and
encapsulating the at least one surface using the epoxy resin composition as claimed in claim 1.

14. A semiconductor apparatus comprising at least one surface having thereon an epoxy encapsulant, the epoxy encapsulant including an inorganic filler having an average particle diameter D50 from about 2 μm to about 10 μm, an average particle diameter D10 of about 3 μm or less, and an average particle diameter D90 from about 6 μm to about 15 μm, and in the inorganic filler, inorganic filler particles having a particle diameter of about 25 μm or more constitute about 0.1 wt % or less of the inorganic filler.

15. The semiconductor apparatus as claimed in claim 14, comprising:
a wiring board,
bumps on the wiring board, and
a semiconductor chip on the bumps,
wherein at least one of a gap between the wiring board and the semiconductor chip, and an upper surface of the semiconductor chip is encapsulated with the epoxy resin composition,
the semiconductor apparatus satisfying at least one of the following conditions:
a gap between the wiring board and the semiconductor chip ranges from about 20 μm to about 80 μm,
a distance between the bumps ranges from about 20 μm to about 200 μm,
the total number of the bumps with respect to a 1 $mm^2$ unit area of the wiring board ranges from about 5 to about 100,
an area of the wiring board ranges from about 10 $mm^2$ to about 400 $mm^2$,
an area of the semiconductor chip ranges from about 8 $mm^2$ to about 360 $mm^2$,
the number of bumps arranged in one direction on the wiring board ranges from about 10 to about 500,
a diameter of an air vent ranges from about 20 μm to about 30 μm, and
a diameter of an injection hole of the epoxy resin composition ranges from about 500 μm to about 5000 μm.

* * * * *